US010086317B2

(12) United States Patent
McKay et al.

(10) Patent No.: US 10,086,317 B2
(45) Date of Patent: Oct. 2, 2018

(54) ISLAND ETCHED FILTER PASSAGES

(71) Applicant: Hewlett-Packard Development Company, L.P., Houston, TX (US)

(72) Inventors: Roger A. McKay, Corvallis, OR (US); Patrick W. Sadik, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 85 days.

(21) Appl. No.: 15/033,000

(22) PCT Filed: Oct. 30, 2013

(86) PCT No.: PCT/US2013/067595
§ 371 (c)(1),
(2) Date: Apr. 28, 2016

(87) PCT Pub. No.: WO2015/065394
PCT Pub. Date: May 7, 2015

(65) Prior Publication Data
US 2016/0346714 A1 Dec. 1, 2016

(51) Int. Cl.
*C23F 1/00* (2006.01)
*B01D 35/02* (2006.01)
(Continued)

(52) U.S. Cl.
CPC ......... *B01D 29/0093* (2013.01); *B01D 35/02* (2013.01); *B01D 67/0032* (2013.01);
(Continued)

(58) Field of Classification Search
CPC ............ B01D 29/0093; B01D 35/02; B01D 67/0032; B01D 69/02; B81C 1/00071; B81C 1/00539; B81C 1/00119; B81C 2201/0115; B81C 2201/014; C23C 14/5873; C23C 18/1603; B81B 7/0061; C23F 1/00; C23F 1/02
(Continued)

(56) References Cited

U.S. PATENT DOCUMENTS 3,615,953 A 10/1971 Hill
6,762,134 B2 7/2004 Bohn et al.
(Continued)

FOREIGN PATENT DOCUMENTS

CN 101083225 12/2007
CN 101131547 2/2008
(Continued)

OTHER PUBLICATIONS

Huang, Zhipeng, et al. "Metalassisted chemical etching of silicon: a review." Advanced materials 23.2 (2011): 285-308.
(Continued)

*Primary Examiner* — Madeline Gonzalez
(74) *Attorney, Agent, or Firm* — Rathe Lindenbaum LLP

(57) ABSTRACT

A method comprises forming etching islands on a substrate and exposing the substrate with etching islands to a solution that reacts with the etching islands to form a filter passage of interconnected pores in the substrate. The filter passage has an inlet into the substrate and an outlet from the substrate.

20 Claims, 6 Drawing Sheets

(51) Int. Cl.
| | |
|---|---|
| *B01D 29/00* | (2006.01) |
| *B81B 7/00* | (2006.01) |
| *B01D 69/02* | (2006.01) |
| *B01D 67/00* | (2006.01) |
| *B81C 1/00* | (2006.01) |
| *C23C 14/58* | (2006.01) |
| *C23C 18/16* | (2006.01) |
| *C23F 1/02* | (2006.01) |

(52) U.S. Cl.
CPC .......... *B01D 69/02* (2013.01); *B81B 7/0061* (2013.01); *B81C 1/00071* (2013.01); *B81C 1/00119* (2013.01); *B81C 1/00539* (2013.01); *C23C 14/5873* (2013.01); *C23C 18/1603* (2013.01); *C23F 1/00* (2013.01); *B01D 2325/021* (2013.01); *B81C 2201/014* (2013.01); *B81C 2201/0115* (2013.01); *B81C 2201/0135* (2013.01); *C23F 1/02* (2013.01)

(58) Field of Classification Search
USPC ........................ 210/321.84, 321.75, 490
See application file for complete search history.

(56) References Cited

U.S. PATENT DOCUMENTS

| 7,135,414 B2 | 11/2006 | Matsumura et al. | |
|---|---|---|---|
| 7,704,809 B2 | 4/2010 | Yeo et al. | |
| 2005/0106318 A1 | 5/2005 | Partridge et al. | |
| 2007/0068866 A1* | 3/2007 | Kneezel ............. | B01D 67/0062 210/321.84 |
| 2008/0090074 A1 | 4/2008 | Matsumura et al. | |
| 2010/0248449 A1 | 9/2010 | Hildreth et al. | |
| 2010/0303674 A1 | 12/2010 | Sutherland et al. | |
| 2011/0116029 A1 | 5/2011 | Funahashi et al. | |
| 2011/0316145 A1 | 12/2011 | Tsao et al. | |
| 2012/0168713 A1 | 7/2012 | Lee et al. | |
| 2013/0102107 A1 | 4/2013 | Hirose et al. | |
| 2014/0248539 A1 | 9/2014 | Liu | |

FOREIGN PATENT DOCUMENTS

| GB | 2495405 A | 4/2013 |
|---|---|---|
| JP | 2004165781 | 6/2004 |
| JP | 4049329 | 12/2007 |
| JP | 2010-248449 | 11/2010 |
| JP | 2013-150978 | 8/2013 |
| WO | WO-2006/051727 | 5/2006 |
| WO | WO-2010102306 | 9/2010 |
| WO | WO-2013093504 | 6/2013 |
| WO | WO-2013/140177 | 9/2013 |

OTHER PUBLICATIONS

Dejarld, et al. "Formation of High Aspect Ratio GaAs Nanostructures with Metal-Assisted Chemical Etching", Jan. 1, 2013, Etchinghttp://www.electrochemsci.org/papers/vol8/80101163.pdf.
Huang, et al. "Oxidation Rate Effect on the Direction of Metal-Assisted Chemical and Electrochemical Etching of Silicon," J. Phys. Chem. C, 2010, 114 (24), pp. 10683-10690.
International Search Report and Written Opinion dated Jul. 7, 2014, PCT Patent Application No. PCT/US2013/067595 dated Oct. 30, 2013, Korean Intellectual Property Office.
International Search Report and Written Opinion dated Jul. 8, 2014, PCT Patent Application No. PCT/US2013/067600 dated Oct. 30, 2013, Korean Intellectual Property Office.
Li, et al., "Metal Assisted Chemical Etching in HF/H2O2 Two Produces Porous Silicon," Appl. Phys. Lett. 77, 2572 (2000).
Li, Zhaochen et al. "Macroporous Silicon Formation on Low-resistivity p-type c-Si Substrate by Metal-catalyzed Electrochemical Etching" International Journal of Electrochemical Science; Jan. 1, 2013; vol. 8; pp. 1163-1169.
Milazzo, et al., "Ag-Assisted Chemical Etching of (100) and (111) n-Type Silicon Substrates by Varying the Amount of Deposited Metal," Journal of The Electrochemical Society, 159 (9) D521-D525 (2012).
Morita, et al. "Simultaneous Flattening of Si(110), (111), and (001) Surfaces for Three-Dimensional Si Nanowires," Applied Physics Letters 100, 261605 (2012).
Te, Yuqiang et al. "Bi/In as Patterning and Masking Layers for Alkaline-based Si Anisotropic Etching", Micromachining and Microfabrication Process Technology VIII; Jan. 7, 2003; vol. 4979; pp. 87-98.

* cited by examiner

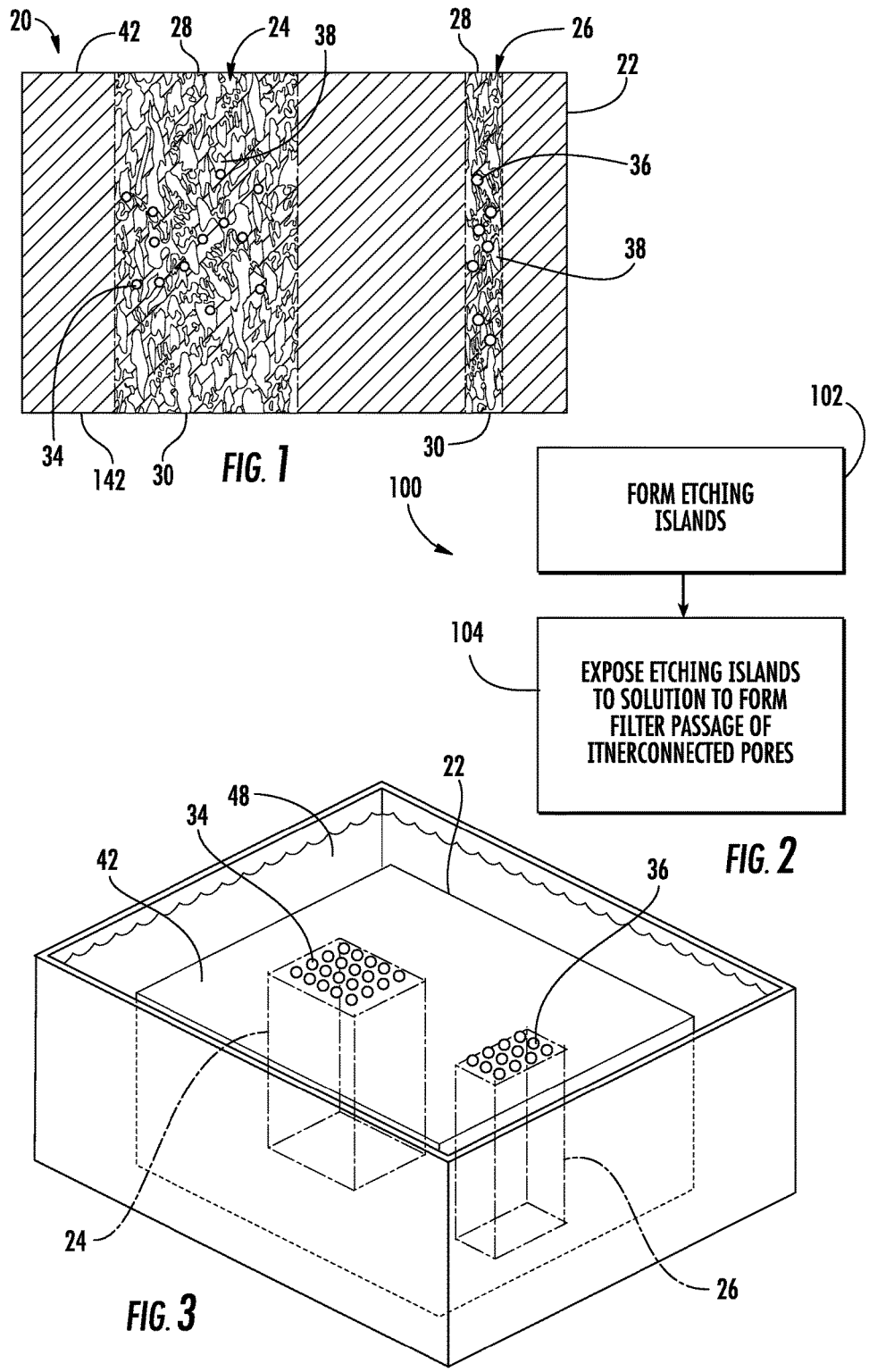

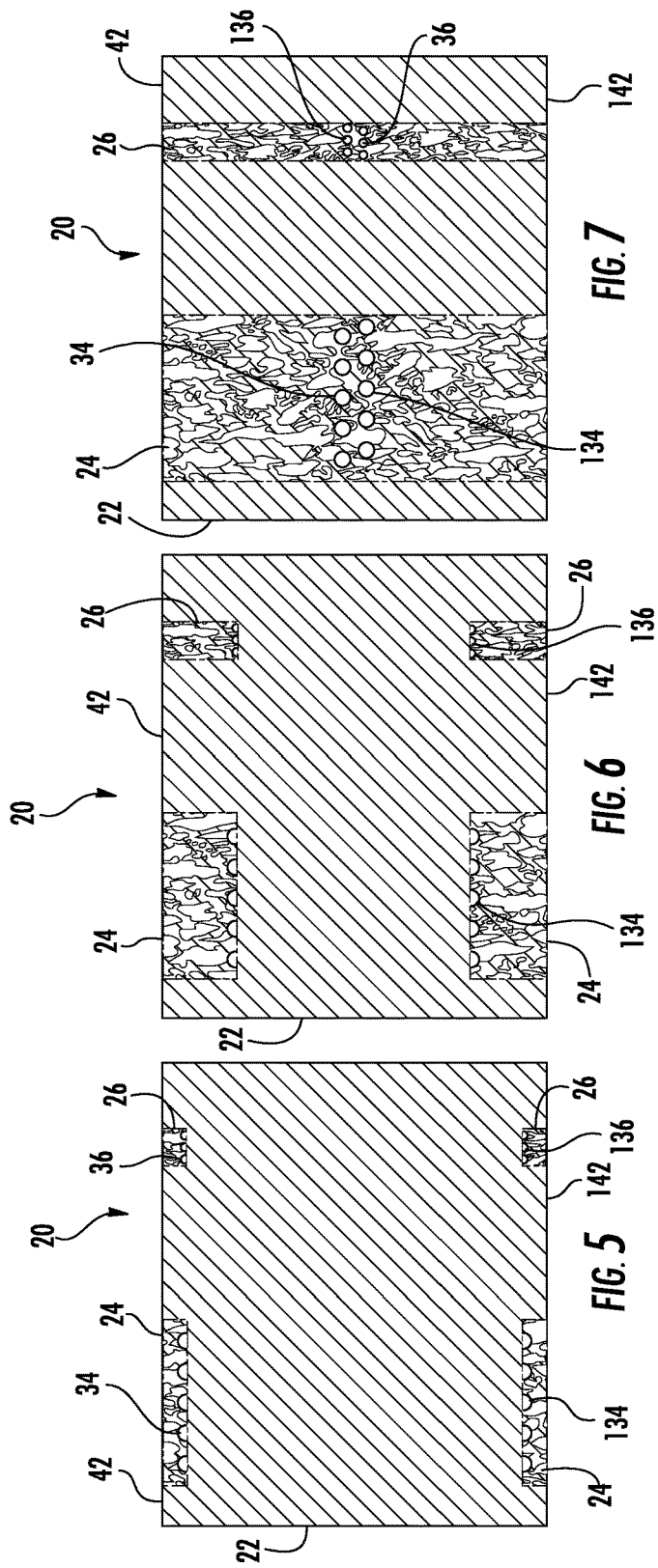

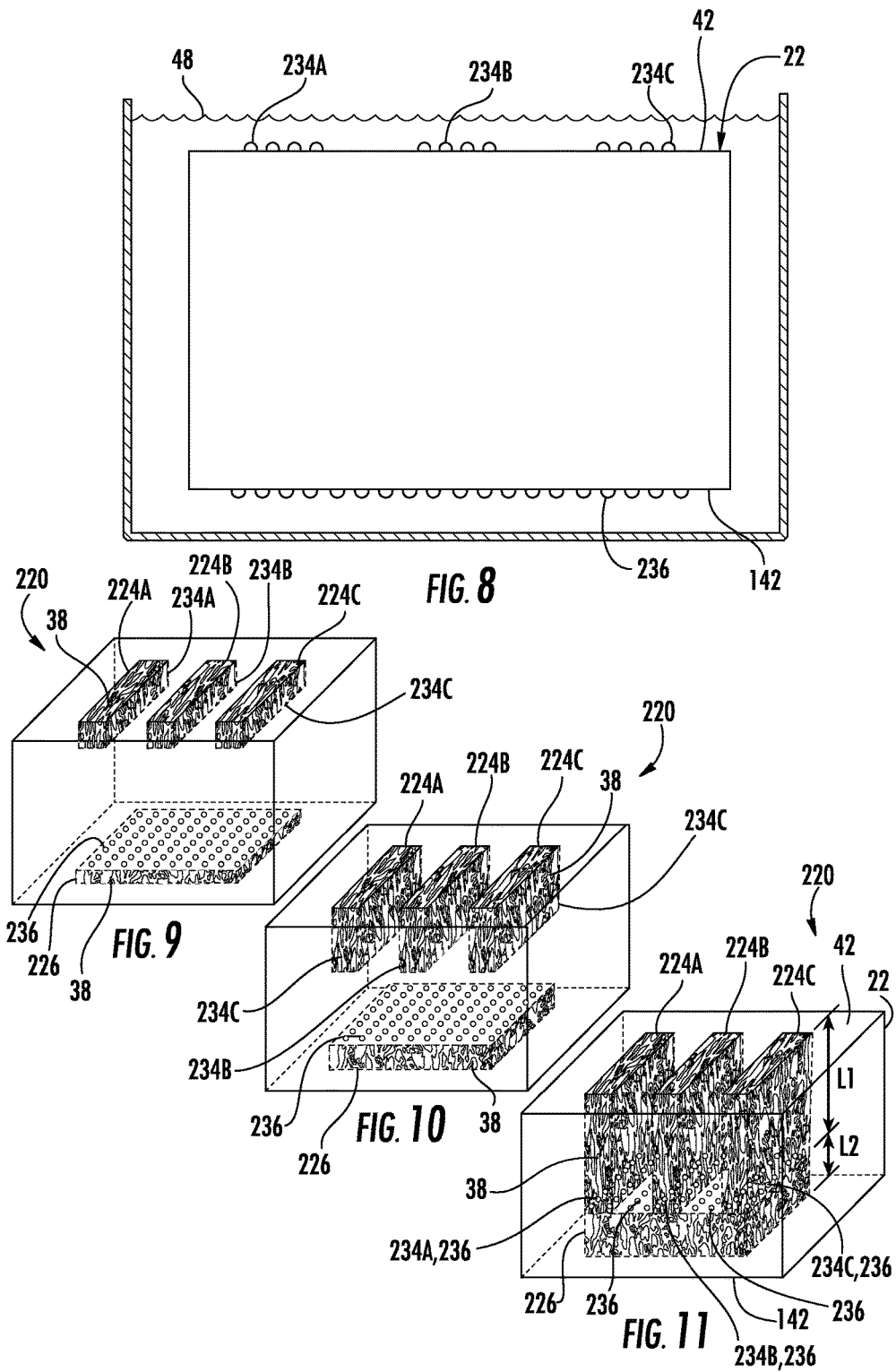

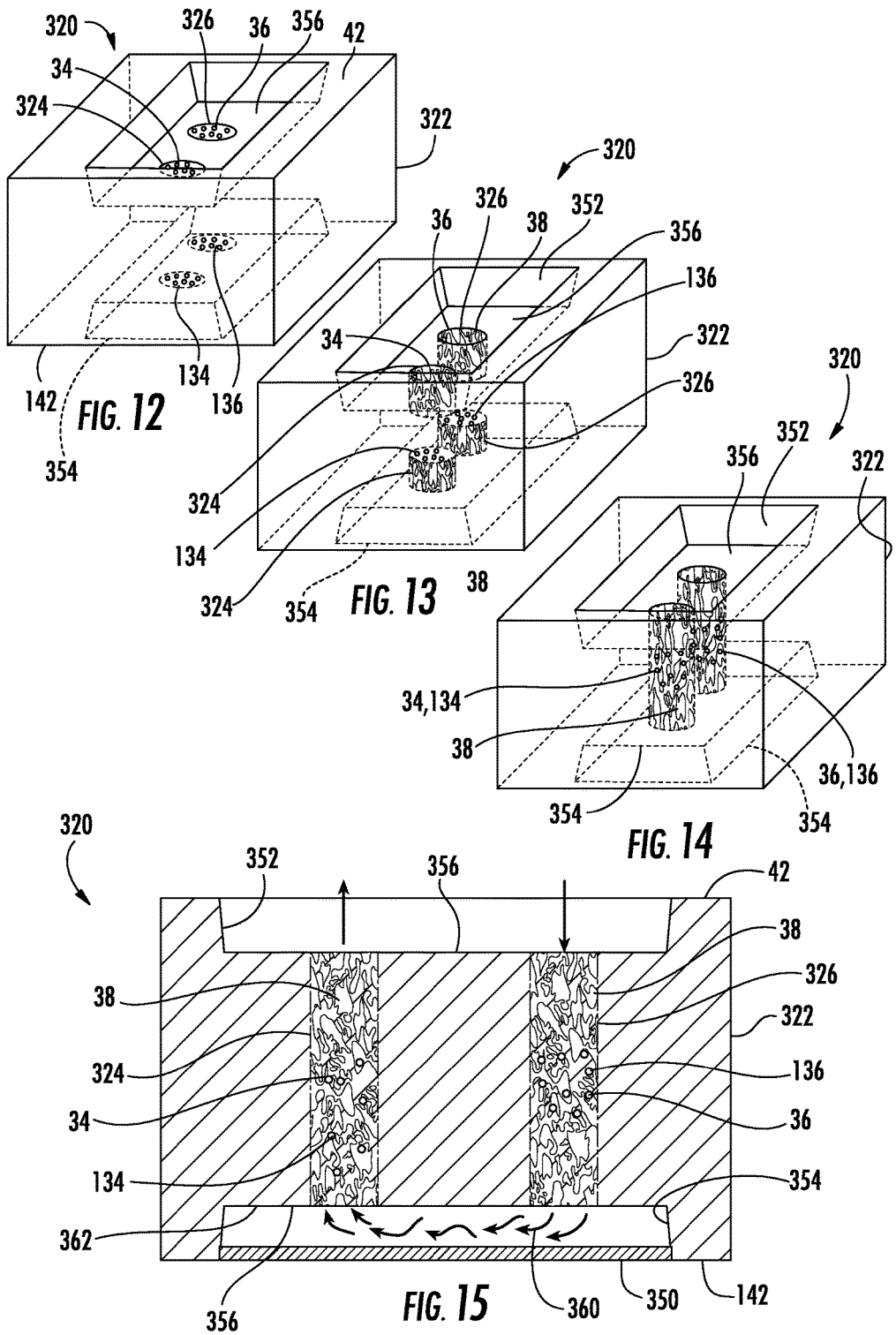

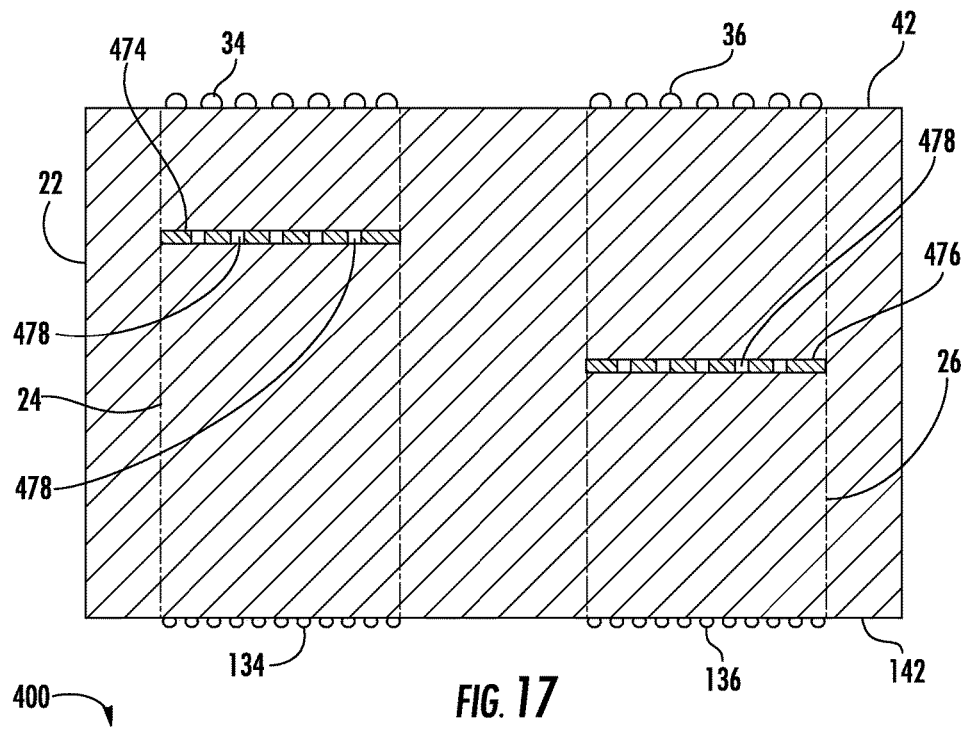
FIG. 17
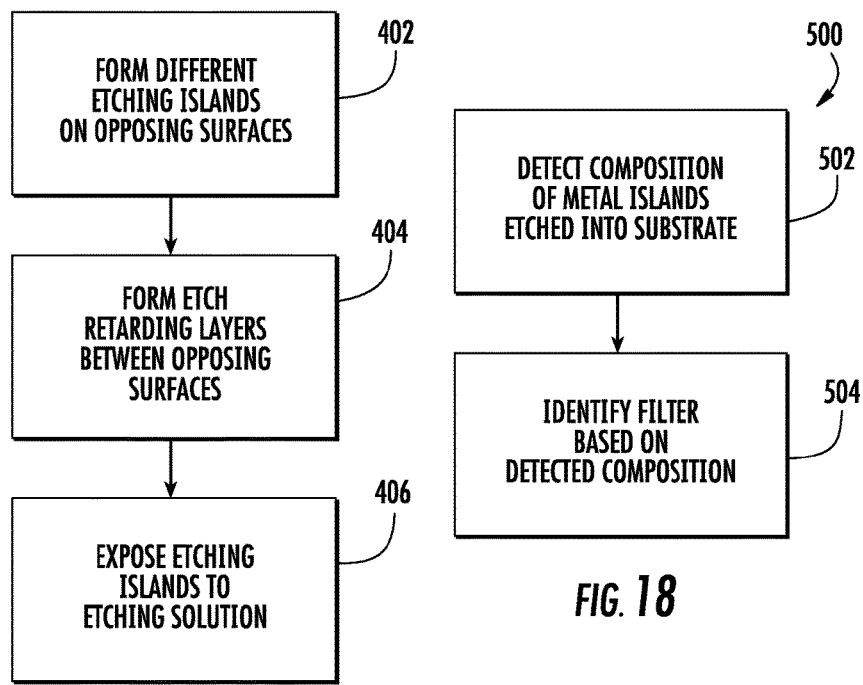
FIG. 16
FIG. 18

US 10,086,317 B2

ISLAND ETCHED FILTER PASSAGES

CROSS-REFERENCE TO RELATED APPLICATION

This application is a U.S. National Stage Application of and claims priority to International Patent Application No. PCT/US2013/067595, filed on Oct. 30, 2013, and entitled "ISLAND ETCHED FILTER PASSAGES," which is hereby incorporated by reference in its entirety.

BACKGROUND

Filter mechanisms are sometimes utilized to remove contaminants or other particles. Small-scale filter mechanisms may be difficult and expensive to manufacture.

BRIEF DESCRIPTION OF THE DRAWINGS

FIG. 1 is a sectional view of an example filter.

FIG. 2 is a flow diagram of an example method for forming the filter of FIG. 1.

FIG. 3 is a perspective view illustrating forming of the filter of FIG. 1 according to the method of FIG. 2.

FIGS. 5-7 are sectional views illustrating etching of the filter of FIG. 1 according to the implementation of the method shown in FIG. 4.

FIG. 8 is a sectional view of a substrate and etching islands being exposed to and etching solution for forming the filter of FIG. 11.

FIGS. 9-11 are perspective views illustrating etching of the substrate of FIG. 8 to form the filter of FIG. 11.

FIGS. 12-14 are perspective views illustrating etching of a substrate to form another example filter shown in FIG. 15.

FIG. 15 is a sectional view of the filter formed by etching of FIGS. 12-14 and with the addition of a trench cover.

FIG. 16 is a flow diagram of an example method for controlling filtering properties when etching a filter.

FIG. 17 is a sectional view of a substrate having etching islands and etch retarding layers for controlling filtering properties of an etched filter.

FIG. 18 is a flow diagram of a method for identifying a filter based upon detected the composition of metal islands etched into a substrate.

DETAILED DESCRIPTION OF THE EXAMPLE EMBODIMENTS

Figure 4:
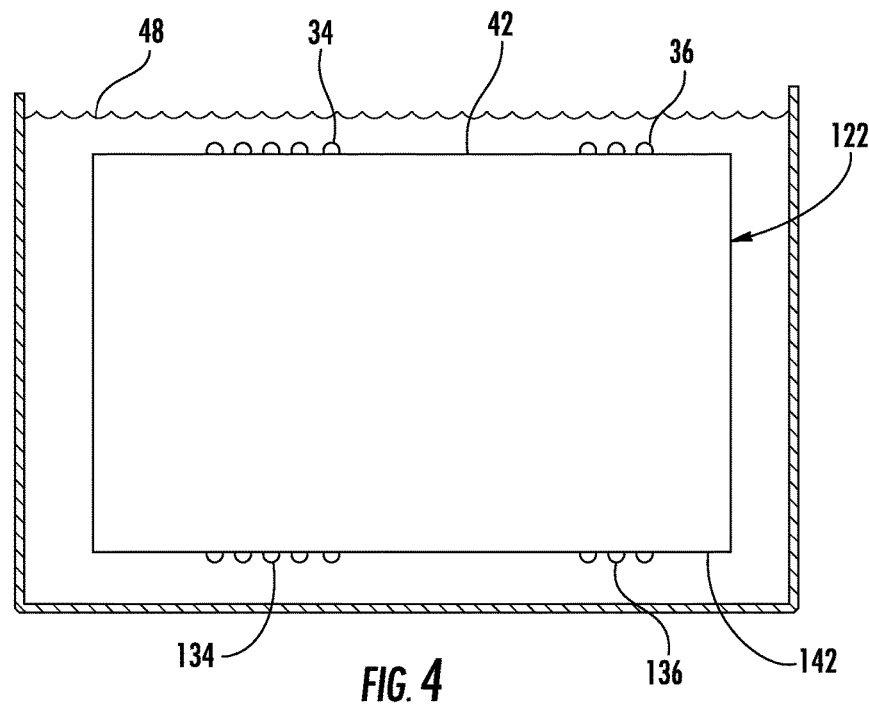
FIG. 4 is a perspective view illustrating forming of the filter of FIG. 1 according to another implementation of the method of FIG. 2.

FIG. 1 is a sectional view illustrating an example filter 20. As will be described hereafter, filter 20 is well-suited to serve as a small-scale filter mechanism. Filter 20 comprises substrate 22, filter passages 24, 26 and metal islands 34, 36.

Substrate 22 comprises a layer or block of material that has properties so as to react with metal islands 34, 36 such that metal islands 34, 36 etch into substrate 22 when substrate 22, having metal islands 34, 36 deposited thereon, is exposed to a solution. In one implementation, substrate 22 has properties so as to react with metal islands 34, 36 configured for metal-assisted chemical etching. In one implementation, substrate 22 comprises silicon, poly-silicon, silicon germanium, a nitride, and oxide, a polymer, a ceramic, a metal, a group III-V material (from the periodic table of elements) or a combination thereof.

Although illustrated as a block, substrate 22 may comprise a layer or any other structure. Substrate 22 may comprise a structure for use in a micro-electromechanical (MEMS) device, a print head or other devices. Although substrate 22 is illustrated as a single block or layer, substrate 22 may comprise one or more layers or blocks positioned or joined to one another. For example, substrate 22 may comprise multiple substrates bonded to one another, wherein the multiple substrates may have the same or different crystal orientations.

Filter passages 24, 26 comprise porous passages extending into and through substrate 22. Filter passages 24, 26 filter fluid such as liquids, gases and may provide two+ phase flow filtration. Each of filter passages 24, 26 comprises an inlet 28 and an outlet 30. Although filter passages 24, 26 are illustrated as extending from a first side 42, through substrate 22 to and out a second opposite side 142 of substrate 22, in other implementations, filter passages 24, 26 may enter substrate 22 on a first side or face and may exit substrate 22 on a second side or face that is nonparallel to the first side or face. For example, one or both of filter passages 24, 26 may enter through a top or bottom of substrate 22 and exit through a side of substrate 22.

Each of filter passages 24, 26 comprises interconnected pores 38, such pores 38 being etched as a result of a reaction between metal islands 34, 36 with a solution to which metal islands 34, 36 and substrate 22 are exposed. In one implementation, filter passages 34, 36 and pores 38 have a maximum dimension or diameter of between 10 nm and 1000 nm and nominally 100 nm. As a result, filtering passages 24, 26 well-suited for small-scale filtering mechanisms such as utilized in MEMs devices. In other implementations, filter passage 34, 36 and pores 38 may have other filtering properties.

Metal islands 34, 36 comprise islands or pockets of metal within and along filter passages 24, 26. Metal islands 34, 36 are composed of metals or other materials having property so as to react with substrate 22 and to etch substrate 22 when exposed to a metal assisted etching solution. In one implementation, metal islands 34, 36 comprises a metal catalyst or other metal that reacts with a solution of hydrofluoric acid and hydrogen peroxide to etch substrate 22. Examples of metals that may be used include, not limited to, silver, platinum, ruthenium, platinum, palladium, molybdenum, chromium, copper, tantalum, titanium, gold, Iridium, and mixtures or alloys thereof.

Metal islands 34, 36 are sized and spaced within substrate 22 based upon the properties of metal islands 34, 36, their reaction rate with the solution during the formation of filter 20 and the size and distribution of metal islands 34, 36 upon an external surface of substrate 22 prior to the metal islands 34, 36 being exposed to the solution. In one implementation, metal islands 34, 36 within substrate 22 that have not merged with other metal islands 34, 36 have a size/diameter distribution (measured in a direction perpendicular to a centerline of fluid passages 24, 26) of between about 10 nm and 200 nm. In one implementation, metal islands 34, 36 have a density within substrate of 25% to 75% of substrate volume. In one implementation, metal etching islands 34, 36 comprise etching materials, such as gold particles, upon surface 42, which prior to etching, have a size/diameter of less than 50 μm with a spacing between adjacent islands from 10 nm to 2000 nm. In one implementation, metal etching island 34, 36, are formed in large groups upon surface 42, wherein such groups of islands 34, 36 are spaced from each other by between 20 μm and 50 μm. Such sizes and densities facilitate the formation of filtering passages 24, 26 for enhanced filtering properties. In other implementations, metal islands 34, 36 may have other sizes and densities.

In one implementation, filtering passages 24, 26 are formed utilizing different metal islands sizes, different metal island densities or different materials for metal islands 24, 26 such that the filtering characteristics of fluid passages 24, 26 and the size or interconnection of pores 38 differ between passages 24, 26. As a result, filter passages 24, 26 provide different filtering functions. In yet other implementations, filter passages 24, 26 are formed utilizing's identical or substantially similar metal islands sizes, metal island densities and/or materials such that the filtering characteristics of fluid passages 24, 26 in the size or interconnection of pores 38 are substantially the same.

In one implementation, the metal islands 34, 36 which become entrained within the porous filter passages 24, 26 may remain with filter 20. Such metal islands 34, 36 may function as signatures, identifying the supplier or source of filter 20, identifying the filtering properties of the different filter passages 24, 26 and/or identifying a batch number or manufacturing date for the particular filter 20. By subsequently analyzing the composition of the entrained metal islands 34, 36, the aforementioned signature may be read.

FIG. 2 is a flow diagram illustrating an example method 100 for forming filter 20. FIG. 3 is a perspective view illustrating the formation of filter 20. As indicated by step 102 in FIG. 2 and shown in FIG. 3, metal islands 34, 36 which form etching islands are formed upon the exterior surface 42 of substrate 22. In the example illustrated, such etching islands 34, 36 are deposited in a pattern or upon selected portions of surface 42 substrate 22 in location so as to subsequently form the underlying filter passages 24, 26 (shown in broken lines). In one implementation, etching islands 34, 36 upon surface 42 have a size/diameter distribution (measured in a direction parallel to surface 42) of between about 10 nm and 200 nm. In one implementation, metal etching islands 34, 36 comprise etching materials, such as gold particles, upon surface 42, which prior to etching, have a size/diameter of less than 50 μm with a spacing between adjacent islands from 10 nm to 2000 nm. In one implementation, metal etching island 34, 36, are formed in large groups upon surface 42, wherein such groups of islands 34, 36 are spaced from each other by between 20 μm and 50 μm. Such sizes and densities facilitate the formation of filtering passages 24, 26 for enhanced filtering properties. In other implementations, metal islands 34, 36 may have other sizes and densities. As noted above, in one implementation, etching islands 34, 36 have properties such that etching islands 34, 36 react differently with a metal assisted etching solution to etch at different rates are to etch differently such that the southerly formed filter passages 24, 26 have different filtering properties.

In one implementation, etching islands 34, 36 are formed upon surface 42 by being sputtered at a power dosage a range of 100 to 200 W for a time range of a few seconds to five minutes. The temperature during such sputtering is in the range of ambient to 250° C. The pressure during sputtering is in the range of 1E-07 Torr to 1E2 Torr. In yet other implementations, the parameters for such sputtering may vary. In yet still other implementations, etching islands 34, 36 may be deposited or otherwise formed upon surface 42 utilizing other deposition techniques such as inkjet printing and the like. In some implementations, the patterning of etching islands 34, 36 upon surface 42 is achieved using masking. In yet other implementations, the patterning of etching 34, 36 upon surface 42 is achieved by controlled inkjet printing.

As indicated by step 104 in FIG. 2 and further illustrated in FIG. 3, once metal islands 34, 36 have been formed or otherwise deposited upon surface 42, etching islands 34, 36 are exposed to solution 48 to form filter passages 24, 26 of interconnected pores 38 (shown in FIG. 1). In the example illustrated, substrate 22 with metal islands 34, 36 deposited on the surface 42, is lowered into a bath of solution 48 which initiates metal assisted chemical etching of pores 38 by etching islands 34, 36. In the example illustrated, solution 48 comprises hydrochloric hydrofluoric acid (HF) and hydrogen peroxide ($H_2O_2$) which reacts with etching islands 34, 36. In other implementations, solution 48 may comprise other fluids or liquids, such as hydrochloric acid (HCL) and hydrogen peroxide ($H_2O_2$), that facilitate a metal assisted etching. In other implementations, etching islands 34, 36 may be exposed to solution 48 in other fashions. Once islands 34, 36 has sufficiently etched into substrate 22, substrate 22 is removed from solution 48. In one implementation, substrate 22 is exposed to an etch stopping or inhibiting quench. For example, substrate 22 may be exposed to a quench of deionized water.

In one implementation, such etching is performing ambient temperature. In some implementations, the etching may occur with a solution 48 at a temperature above ambient to increase or otherwise the impact the etch rate or etching characteristics. In one implementation, the etching of substrate 22 is performed under agitation. In another implementation, such etching may be performed in a still bath. The formulation of solution 48 may vary to provide a particular etch rate. For example, the ratio of hydrogen peroxide to hydrofluoric acid to water may depend upon a particular etch rate. This ratio may be adjusted during etching by islands 34, 36.

Figure 4A:
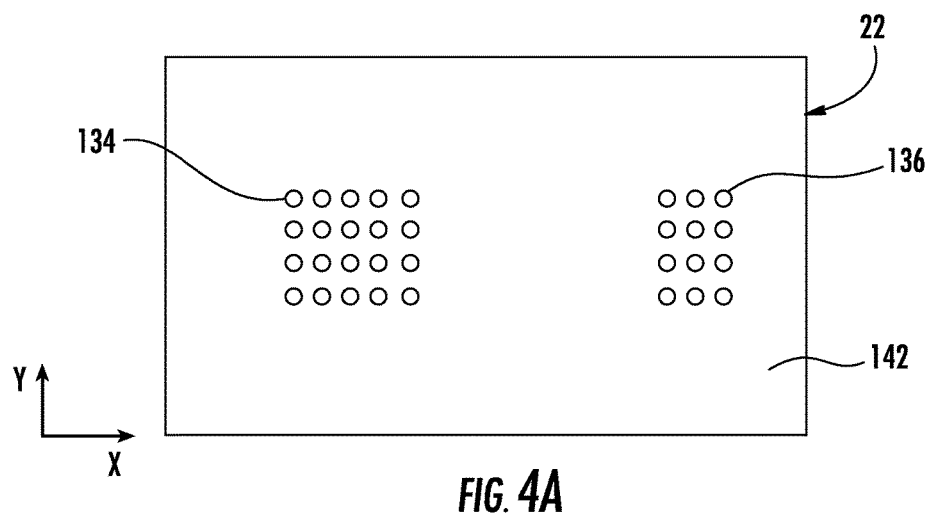
FIG. 4A is a bottom plan view of a substrate and deposited etching islands of FIG. 4.

FIGS. 4-7 illustrate another example implementation of method 100 shown in FIG. 2. In contrast to the implementation shown FIG. 3, the implementation shown in FIGS. 4 and 4A involves additionally forming etching islands 134, 136 on the bottom surface 142 of substrate 22, which is opposite to and parallel to surface 42. In the example illustrated, etching islands 134, 136 are substantially similar to and opposite to etching islands 34 and 36 on face 42. In another implementation, etching islands 134, 136 are slightly offset in one or both of the x and y directions with respect to etching islands 34, 36, respectively, to enhance or facilitate the formation of pores 38. Although FIGS. 4 and 4A illustrate an equal number of corresponding islands 34,134, and 36,136 on surfaces 42 and 142, respectively, in other implementations, the number and location of islands 34 may differ than the number and location of islands 134. Likewise, the number and location of islands 36 may differ than the number and location of islands 136. As shown by FIG. 4, once etching islands 34, 36, 134, 136 have been formed or otherwise deposited upon surfaces 42, 142, respectively, such islands are exposed to solution 48. In the example illustrated, substrate 22 is immersed in bath 48 which commences etching.

As shown by FIGS. 5-7, upon being exposed to a metal assisted etching solution (a combination of water, hydrofluoric acid and hydrogen peroxide in the example illustrated), islands 34, 36 on surface 42 and islands 134, 136 on surface 142 concurrently etch into substrate 22 from opposite sides or surfaces 42, 142. As shown by FIG. 7, in the example illustrated, such concurrent etching is allowed to continue until islands 34, 36 and islands 134, 136 have sufficiently sunk into substrate 22 or etched into substrate 22 so as to meet or pass each other within substrate 22. In one implementation, such etching allowed to continue until the etching islands 34, 36, 134, 136 meet, forming filter passages 24, 26.

In yet another implementation, such etching is allowed to continue until etching islands 34, 36, 134, 136 have passed one another within substrate 22 by a predetermined extent. By controlling the extent to which etching islands 34, 36, 134, 136 pass one another, continuing to etch through regions previously etched by the etching islands that have been passed, at least selected portions of substrate 22 are etched twice, once by one of etching islands 34, 36 and a second time by etching islands 134, 136 or vice versa. As a result, the porosity and filtering characteristics of filter passages 24 and 26 may be controlled and adjusted. As noted above, in one implementation such etching is terminated by removing substrate 22 from the metal assisted etching solution 48 and by subjecting substrate 22 to a quench of deionized water or other quenching liquid.

By etching filter passages 24, 26 from opposite sides of substrate 22, the time to form filter passages 24, 26 and reduced, reducing cost. In addition, the etching islands 34, 36, 134, 136 are more reliably retained within substrate 22 during the formation of filter 20. As a result, the composition of etching islands 34, 36, 134, 136 may be more reliably ascertained for use as a signature such as for identifying the source of filter 20, the filtering characteristics of filter 20 and/or a manufacturing or fabrication batch or manufacture site for filter 20.

FIG. 11 illustrates filter 220, another implementation of filter 20. As shown by FIG. 11, filter 220 comprises substrate 22 (described above), filter passages 224A, 224B, 224C (collectively referred to as filter passages 224) and 226, and etching islands 234A, 234B, 234C (collectively referred to as etching islands 234) and 236.

Filter passages 224 comprise distinct spaced filter passages extending from surface 42 of substrate 22 to filter passage 226. As with filter passages 24 and 26, filter passages 224 comprise interconnected pores 38, such pores 38 being etched as a result of a reaction between metal islands 234 with a solution to which metal islands 234 and substrate 22 are exposed. In one implementation, filter passage 224 and its pores 38 have a maximum dimenstion or diameter of between 10 nm and 1000 nm and nominally 100 nm. As a result, filter passages 224 are well-suited for small-scale filtering mechanisms such as utilized in MEMs devices. In other implementations, filter passage 224and its pores 38 may have other filtering properties.

In one implementation, each of filter passages 224 have different filtering characteristics and/or are to be connected to different sources of fluids to be filtered. For example, in one implementation, filter passage 224A have a first density of pores 38 or pores 38 having a first average size while filter passage 224B has a second different density of pores 38 and/or pores 38 having a second different average size while filter passage 224C has yet a third different density of pores 38 and/or pores 38 having a third different average size. In yet other implementations, each of filter passages 224 may have similar filtering properties.

Filter passage 226 receives filtered fluid from each of filter passages 224 and provides additional second stage filtering. Filter passage 226 comprises interconnected pores 38, such pores 38 being etched as a result of a reaction between metal islands 236 with a solution to which metal islands 236 and substrate 22 are exposed. In one implementation, filter passage 226 and pores 38 of filter passage 226 have a size, maximum dimension or size of between 10 nm and 1000 nm and nominally 100 nm. As a result, filter passage 226 is well-suited for small-scale filtering mechanisms such as utilized in MEMs devices.

In one implementation, filter passage 226 has filtering properties different than those of one or more of filter passages 224. For example, in one implementation, filter passage 226 may comprise pores 38 having a density or size different from that of one or more of filter passages 224. In other implementations, filter passage 226 and its pores 38 may have other filtering properties.

As further shown by FIG. 11, in the example illustrated, each of filter passages 224 has a length L1 while filter passage 226 has a length L2 less than L1. As a result, the time or extent to which fluid passing through filter passes 224 is greater than the time or extent to which the same fluid passes through filter passage 226. The additional length of filter passes 224 is a parameter that impacts filtering properties of filter 220. As will be described hereafter, in one implementation, the different lengths L1 and L2 are achieved by employing etching islands 234 which have different etching characteristics or properties as compared to etching islands 236 when exposed to etching solution 48 left front shown in FIG. 8). As a result, the different lengths L1, L2 can be achieved while also employing simultaneous etching from both surfaces 42, 142 of substrate 22. In yet another implementation, the different lengths L1, L2 are achieved by sequentially etching fluid passages 224 and 226, employing different etching time periods before a quench or other etching stop is employed.

Although filter passes 224 are each illustrated as having substantially the same length and although filter passage 226 is illustrated as being connected to each of filter passes 224 at substantially the same depth within substrate 22, in other implementations, one or more of filter passages 224 may have different lengths as compared to one another. For example, in one implementation, filter passage 224A may have a shorter length as compared to filter passages 224B and 224C. In such an implementation, filter 220 comprises an additional lower filter passage having filtering properties similar to filter passage 226, but having a greater length so as to connect to the additional lower filter passage having the shorter length. In yet another implementation, one or more of filter passages 244 may alternatively extend completely through substrate 22, by passing and not being connected to filter passage 226.

Etching islands 234, 236 are similar to islands 34, 36, 134, 136 described above. Etching islands 234, 236 comprise islands or pockets of metal within and along filter passages 224, 226. Etching islands 234, 236 are composed of metals or other materials having property so as to react with substrate 22 and to etch substrate 22 when exposed to a metal assisted etching solution. In one implementation, etching islands 234, 236 comprises a metal catalyst or other metal that reacts with a solution of hydrofluoric acid and hydrogen peroxide to etch substrate 22. Examples of metals that may be used include, not limited to, silver, platinum, ruthenium, platinum, palladium, molybdenum, chromium, copper, tantalum, titanium, gold, Iridium, and mixtures or alloys thereof.

Etching islands 234, 236 are sized and spaced within substrate 22 based upon the properties of etching islands 234, 236, their reaction rate with the solution during the formation of filter 20 and the size and distribution of metal islands 34, 36 upon an external surface of substrate 22 prior to the metal islands 34, 36 being exposed to the solution. In one implementation, etching islands 234, 236 within substrate 22 that have not merged with other etching islands 234, 236 have a size/diameter distribution (measured in a direction perpendicular to a centerline of fluid passages 224, 226) of between about 10 nm and 200 nm. In one implementation, etching islands 234, 236 have a density within substrate of 25% to 75% of the substrate volume. In one implementation, metal etching islands 34, 36 comprise etching materials, such as gold particles, upon surface 42, which prior to etching, have a size/diameter of less than 50 µm with a spacing between adjacent islands from 10 nm to 2000 nm. In one implementation, metal etching island 34, 36, are formed in large groups upon surface 42, wherein such groups of islands 34, 36 are spaced from each other by between 20 µm and 50 µm.. Such sizes and densities facilitate the formation of filtering passages 224, 226 for enhanced filtering properties. In other implementations, etching islands 234, 236 may have other sizes and densities.

In one implementation, filtering passages 224, 226 are formed utilizing different metal islands sizes, different metal island densities or different materials for edging islands 224, 226 such that the filtering characteristics of fluid passages 224, 226 and the size or interconnection of pores 38 differ between passages 224, 226. As a result, filter passages 224, 226 provide different filtering functions. In yet other implementations, filter passages 224, 226 are formed utilizing identical or substantially similar metal or etching island sizes, etching island densities and/or materials such that the filtering characteristics of fluid passages 224, 226 and the size or interconnection of pores 38 are substantially the same.

In one implementation, the etching islands 234, 236 which become entrained within the porous filter passages 224, 226 may remain with filter 220. Such etching islands 234, 236 may function as signatures, identifying the supplier or source of filter 220, identifying the filtering properties of the different filter passages 224, 226 and/or identifying a batch number or manufacturing date for the particular filter 220. By subsequently analyzing the composition of the entrained metal islands 234, 236, the aforementioned signature may be read.

FIGS. 8-11 illustrate another implementation of the method outlined in FIG. 2 and described with respect to FIGS. 4-7. FIGS. 8-11 illustrate the forming of filter 220 (illustrated in a completed state in FIG. 11). FIG. 8 illustrates a deposition of etching islands 234, 236 upon substrate 22 in the positioning of substrate 22 within etching solution 48, prior to the initiation of etching. FIGS. 9 and 10 illustrate substrate 22 in process of being etched by etching islands 234, 236. FIG. 11 illustrates the completed filter 220.

The method shown in FIGS. 8-11 forming filter 220 is similar to the method shown and described above with respect to FIGS. 4-7 except that etching islands 234 deposit on surface 42 and etching islands 236 deposited upon surface 142 (as shown in FIG. 8) have different etching properties are etching rates when exposed to etching solution 48. As a result, although filter passes 224, 226 are simultaneously etched from opposite surfaces 42, 142, filter passes 224, 226 have different lengths L1, L2 (described above). In one implementation, etching islands 234 are comprised of different materials as compared to materials of etching islands 236 so as to etch at a greater rate as compared to etching islands 236. In yet another implementation, etching islands 234 have a greater density or a greater size as compared to etching islands 236 so as to etch at a greater rate as compared to etching islands 236.

FIG. 15 illustrates filter 320, another implementation of filter 20. Filter 320 provides prolonged filtering of fluids utilizing a relatively thinner substrate 322. In particular, filter 320 filters fluid flowing into opposite directions through substrate 322 to provide an effectively longer filter with a proportionally thinner substrate 322.

As shown by FIG. 15, filter 320 comprises substrate 322, filter passages 324, 326, etching islands 24, 26, 124, 126 (described above) and trench cover 350. Substrate 322 is similar to substrate 22 described above except that substrate 322 is illustrated as specifically comprising trenches 352, 354. Trenches 352, 354 comprise troughs, channels, grooves, recesses, depressions or like extending into faces 42, 142. Each of trenches 352, 354 have a floor 356 from which filter passes 324, 326 extend.

Trench 352 facilitates connection of a source of fluid (whether the fluid be a liquid, gas or multi-phase material) to be filtered to filter passage 326 and connection of a receiver of filtered fluid to filter passage 324. In other implementations, trench 352 may be omitted. Trench 354 provides a fluid flow passage between filter passages 324, 326, allowing fluid that has been filtered by filter passage 326 to flow within trench 354 into filter passage 324 as indicated by arrows 360. Although illustrated as being rectangular or trapezoidal, trenches 352, and 354 may have other sizes, shapes and configurations.

Filter passages 324, 326 are similar to filter passages 24, 26 described above except that filter passages 324, 326 extend between floors 356 of trenches 352, 354. In one implementation, filter passages 324, 326 have similar filtering properties. In yet another implementation, filter passages 324, 326 have differing filtering properties as a result of being etched by etching islands 24, 26, 124, 126 having different etching properties. In the example illustrated, filter passage 326 has an inlet on floor 356 of trench 352 adjacent surface 42 and an outlet on floor 356 of trench 354 adjacent surface 142. Filter passage 324 has an inlet on floor 356 of trench 354 adjacent surface 142 and an outlet on floor 356 of trench 356 adjacent surface 42.

Trench cover 350 comprises a cap, top or cover extending across trench 354 so as to enclose an interior of trench 354. Trench cover 350 forms a flow passage 362 extending between the outlet of filter passage 326 and the inlet of filter passage 324. As a result, fluid being filtered flows in a U-turn path, flowing into filter pass 326, across flow passage 362 and through filter passage 324, providing an elongated filtering path utilizing the thickness of substrate 322 twice for the filtering path. In other implementations, filter 320 may comprise multiple spaced trenches, greater than two filter passages and more than one trench covers so as to form an overall serpentine path back and forth through substrate 322 for even longer filtering paths.

FIGS. 12-15 illustrate an example method for forming filter 320. FIG. 12 illustrates the formation of trenches 352, 354 in faces 42, 142 of substrate 322. FIG. 12 further illustrates the deposition or forming of etching islands 34, 134, 36, 136 prior to substrate 322 being exposed to etching solution 48. FIG. 13 illustrates etching of substrate 322 by etching islands 34, 134, 36, 136. FIG. 14 illustrates a completion of such etching while FIG. 15 illustrates the addition of trench cover 350 in the flow direction through filtering passages 326, 324. The method shown in FIGS. 12-15 forming filter 220 is similar to the method shown and described above with respect to FIGS. 4-7. As a result, filter passes 224, 226 are simultaneously etched from opposite surfaces 42, 142.

FIG. 17 illustrates method 400, an example implementation of method 100 shown in FIG. 2, for controlling and/or adjusting filtering properties of a filter formed by method 100. As indicated by step 402, etching islands with different etching properties are formed on opposing surfaces of substrate 22. As indicated by step 404, etch retarding layers are formed between such opposing surfaces. FIG. 17 illustrates the carrying out of steps 402, 404. FIG. 17 illustrates substrate 22 after deposition of etching islands 34, 36, 134, 136 upon surfaces 42 and 142 and the formation of at retarding layers 474, 476 within substrate 22, but prior to substrate 22 and etching islands 34, 36, 134, 136 being exposed etching solution 48 (shown in FIG. 4) and prior to any etching of filter passages 24, 26 (shown in broken lines).

Etch retarding layers 474, 476 comprise layers of material that impede, resist or hinder etching by etching islands 34, 134 and/or etching islands 36, 136. Etch retarding layer 474 is formed between etching islands 34, 134. Etch retarding layer 476 is formed between etching islands 36, 136. As a result, etch retarding layers 474 limits and controls the depth or length of the portion of filtering passage 24 etched by etching islands 34 and the depth or length of the portion of filtering passage 24 etched by etching islands 134. Likewise, etch retarding layer 474 limits and controls the depth or length of the portion of filtering passage 26 etched by etching islands 36 in the depth or length of the portion of filtering passage 26 etched by etching islands 136. Etch retarding layers 474, 476 allow the filtering characteristics of filtering passages 24 and 26 to be adjusted. For example, in one implementation, etching islands 34, 36 have different etching properties as compared to etching islands 134, 136. The filtering characteristics of those portions etched by etching islands 34, 36 have different filtering characteristics as compared to those portions etched by etching islands 134, 136. By varying the percentage of filter passage 24 that is composed of portions formed by etching islands 34 as compared to portions formed by etching islands 134, the overall filtering properties of filter passage 24 may be adjusted or controlled. Similar filtering property adjustment may be made by selectively positioning or forming etch retarding layer 476 between etching islands 36, 136 in a similar fashion.

In the example illustrated, etch retarding layers 474, 476 each comprises layers of etch retarding material such as buried oxide. In one implementation, etch retarding layers 474, 476 comprise layers formed by doping of substrate 22. In one implementation, layers 474, 476 are patterned so as to include apertures 478 therethrough, allowing fluid to flow across the etch retarding layers of 474, 476. In yet another implementation, layers 474, 476 are thin or otherwise configured such that etching islands 34, 134 form interconnecting flow passages or interconnected pores across and through layers 474, 476. In yet other implementations, etch retarding layers 474, 476 may be formed from other materials and may be formed or located in other fashions.

As indicated by step 406, etching islands 34, 36, 134, 136 are simultaneously are concurrently exposed to etching solution 48 (shown in FIG. 4) to form filter passages 24, 26. Although illustrated as forming two similarly sized filter passages 24, 26 in substrate 22, method 400 may additionally be used to form filter passes having different sizes and locations. For example, in another implementation, method 400 is utilized in forming filter 220 (shown in FIG. 11) and filter 320 (shown in FIG. 15).

As noted above, etching islands 34, 36, 134, 136 have specific compositions that serve as signatures similar to a barcode or serial number, allowing subsequent determination of various information regarding the particular filter such as an identification of the supplier or source of filter 20, an identification of the filtering properties of the different filter passages 24, 26 and/or an identification of a batch number or manufacturing date for the particular filter 20. FIG. 18 is a flow diagram illustrating an example method 500 for utilizing the signature properties of etching islands 34, 36, 134, 136. As indicated by step 502, one of more sensors are utilized attacked the composition of metal islands 34, 36, 134 and/or 136 within the substrate of a filter. In one implementation, different manufacturing sites may employ different specific compositions for such etching islands. In one implementation, different batches of filters may be provided with different compositions for etching islands. In one implementation, a manufacture may utilize a specific non-functional composition or ratio of materials for the etching islands that remain within the substrate after formation of the filter.

As indicated by step 504, using the detected composition of the metal etching islands etched into the substrate, an identification of the particular filter is made. In one implementation, a processor, following instructions contained in a non-transitory computer readable medium, compares the detected composition of the metal etching islands etched in the substrate to a lookup table or other database to identify the filter and output or display the identification of the filter. For purposes of this disclosure, identifying the filter means determining one or more of the authenticity of the filter (versus a counterfeit), the batch number or manufacturing time for the particular filter, the filtering properties for the particular filter, the manufacturing site for the particular filter and the like.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
    forming etching islands on a substrate;
    exposing the substrate with etching islands to a solution that reacts with the etching islands to form a filter passage of interconnected pores in the substrate, the filter passage having an inlet into the substrate and an outlet from the substrate; and
    forming an etch controller within the substrate, the etch controller adjusting an etch rate of the etch islands when interacting with the etch islands within the substrate.

2. The method of claim 1, wherein the inlet is on a first face of the substrate and the outlet is on a second face of the substrate.

3. The method of claim 2, wherein the first face and the second face are parallel.

4. The method of claim 2 wherein the forming of the etching islands comprises forming first etching islands on the first face and second etching islands on the second face.

5. The method of claim 4, wherein the first etching islands on the first face and the second etching islands on the second face concurrently react in response to exposure to the solution to concurrently etch into the substrate from the first face and the second face, respectively.

6. The method of claim 1 further comprising forming a trench in the substrate, the trench having a floor, wherein the etching islands are formed on the floor of the trench.

7. The method of claim 1 further comprising:
forming second etching islands on the substrate;
exposing the substrate with the second etching islands to the solution that reacts with the second etching islands to form a second filter passage of interconnected pores in the substrate, the second passage being spaced from the first passage by nonporous regions of the substrate.

8. The method of claim 7, wherein the etching islands remain within the substrate along at least one of the first filter passage and the second filter passage.

9. The method of claim 1, wherein the etch controller comprises an etch retardant.

10. The method of claim 7 further comprising:
forming a second etch controller within the substrate, the second etch controller adjusting an etch rate of the second etch islands when interacting with the second etch islands within the substrate.

11. The method of claim 10, wherein the etch controller is at a first depth relative to a surface portion of the substrate upon which the etching islands are formed and wherein the second etch controller is at a second depth relative to a second surface portion of the substrate upon which the second etching islands are formed, the second depth being different than the first depth.

12. The method of claim 1, wherein the etch controller is formed within the substrate prior to exposure of the substrate with the etching islands to the solution.

13. The method of claim 1, wherein the etch controller comprises a buried oxide.

14. The method of claim 1, wherein the forming of the etch controller within the substrate comprises doping of the substrate.

15. The method of claim 1, wherein the etch controller comprises an etch retarding layer having apertures therethrough.

16. A method comprising:
forming a trench in a substrate, the trench having a floor;
forming etching islands on the substrate;
exposing the substrate with the etching islands to a solution that reacts with the etching islands to form a filter passage of interconnected pores in the substrate, the filter passage having a mouth extending from the floor of the substrate into the substrate.

17. The method of claim 16 further comprising:
forming second etching islands on the substrate; and
exposing the substrate with the second etching islands to the solution that reacts with the second etching islands to form a second filter passage of interconnected pores in the substrate, the second filter passage having a second mouth extending from the floor of the substrate into the substrate, the second filter passage being spaced from the first filter passage by nonporous portions of the substrate.

18. The method of claim 17 further comprising forming a trench cover across the trench to form a fluid flow passage between the first mouth and the second mouth.

19. A method comprising:
forming first etching islands on a first face of a substrate, the first etching islands having a first etching characteristic in a solution;
forming second etching islands on a second face of the substrate, the second etching islands having a second etching characteristic in the solution different than the first etching characteristic;
exposing the substrate with first etching islands and the second etching islands to the solution that reacts with the first etching islands and the second to form a first filter passage of interconnected pores in the substrate having a first filtering property defined by the first etching islands and to form a second filter passage of interconnected pores joined to the first filter passage within the substrate, the second filter passage having a second filtering property defined by the second etching islands, the second filtering property being different than the first filtering property to form a two-stage filter through the substrate.

20. The method of claim 19 further comprising:
forming third etching islands on the first face of the substrate, the third etching islands having a third etching characteristic in the solution; and
exposing the substrate with the third etching islands to the solution that reacts with the third etching islands to form a third filter passage of interconnected pores joined to the second filter passage within the substrate, the third filter passage having a third filtering property defined by the third etching islands, the third filtering property being different than the first filtering property and the second filtering property.

* * * * *

UNITED STATES PATENT AND TRADEMARK OFFICE
CERTIFICATE OF CORRECTION

PATENT NO. : 10,086,317 B2  Page 1 of 1
APPLICATION NO. : 15/033000
DATED : October 2, 2018
INVENTOR(S) : Roger A. McKay et al.

It is certified that error appears in the above-identified patent and that said Letters Patent is hereby corrected as shown below:

In the Drawings

In sheet 1 of 6, FIG. 2, reference numeral 104, Line 4, delete "ITNERCONNECTED" and insert -- INTERCONNECTED --, therefor.

Signed and Sealed this
Ninth Day of April, 2019

Andrei Iancu
*Director of the United States Patent and Trademark Office*